US010256325B2

(12) United States Patent
Gamerith et al.

(10) Patent No.: US 10,256,325 B2
(45) Date of Patent: Apr. 9, 2019

(54) RADIATION-HARDENED POWER SEMICONDUCTOR DEVICES AND METHODS OF FORMING THEM

(71) Applicant: Infineon Technologies Austria AG, Villach (AT)

(72) Inventors: Stefan Gamerith, Villach (AT); Markus Schmitt, Neubiberg (DE); Winfried Kaindl, Unterhaching (DE); Gerald Sölkner, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 145 days.

(21) Appl. No.: 13/672,185

(22) Filed: Nov. 8, 2012

(65) Prior Publication Data

US 2014/0124851 A1 May 8, 2014

(51) Int. Cl.
| | | |
|---|---|---|
| *H01L 29/66* | (2006.01) | |
| *H01L 29/423* | (2006.01) | |
| *H01L 29/78* | (2006.01) | |
| *H01L 29/06* | (2006.01) | |
| *H01L 29/08* | (2006.01) | |
| H01L 29/417 | (2006.01) | |
| H01L 29/10 | (2006.01) | |

(52) U.S. Cl.
CPC .... *H01L 29/66712* (2013.01); *H01L 29/0634* (2013.01); *H01L 29/0878* (2013.01); *H01L 29/42368* (2013.01); *H01L 29/7802* (2013.01); H01L 29/1095 (2013.01); H01L 29/41766 (2013.01); H01L 29/66727 (2013.01)

(58) Field of Classification Search
CPC ....... H01L 29/7395; H01L 2924/13055; H01L 29/0634; H01L 29/1095
See application file for complete search history.

(56) References Cited

U.S. PATENT DOCUMENTS

| | | | | |
|---|---|---|---|---|
| 5,831,318 A | * | 11/1998 | Spring ............. | H01L 29/42368 257/285 |
| 7,576,393 B2 | * | 8/2009 | Ono .................... | H01L 29/0634 257/341 |
| 2002/0036311 A1 | * | 3/2002 | Hattori ............. | H01L 29/42368 257/302 |
| 2004/0108568 A1 | * | 6/2004 | Qu ...................... | H01L 29/0634 257/500 |
| 2004/0155286 A1 | * | 8/2004 | Salih .................. | H01L 29/0878 257/328 |

(Continued)

FOREIGN PATENT DOCUMENTS

DE  102008056574 A1  6/2009

*Primary Examiner* — Marc Armand
*Assistant Examiner* — Quinton Brasfield
(74) *Attorney, Agent, or Firm* — Murphy, Bilak & Homiller, PLLC

(57) ABSTRACT

According to an embodiment, a method of forming a power semiconductor device is provided. The method includes providing a semiconductor substrate and forming an epitaxial layer on the semiconductor substrate. The epitaxial layer includes a body region, a source region, and a drift region. The method further includes forming a dielectric layer on the epitaxial layer. The dielectric layer is formed thicker above a drift region of the epitaxial layer than above at least part of the body region and the dielectric layer is formed at a temperature less than 950° C.

10 Claims, 6 Drawing Sheets

(56) References Cited

U.S. PATENT DOCUMENTS

| | | | |
|---|---|---|---|
| 2004/0266117 A1* | 12/2004 | Hwang | H01L 21/28176 438/287 |
| 2008/0203400 A1* | 8/2008 | Fukuda | H01L 21/049 257/77 |
| 2009/0159927 A1* | 6/2009 | Willmeroth | H01L 29/0634 257/139 |
| 2009/0166722 A1* | 7/2009 | Hebert | H01L 29/0634 257/328 |
| 2009/0176341 A1* | 7/2009 | Saggio | H01L 29/0634 438/268 |
| 2009/0309157 A1* | 12/2009 | Watanabe | H01L 29/0649 257/336 |
| 2010/0065857 A1* | 3/2010 | Harada | H01L 21/02378 257/77 |
| 2010/0148254 A1* | 6/2010 | Park | 257/337 |
| 2010/0187604 A1* | 7/2010 | Ono | H01L 29/0634 257/335 |
| 2011/0101446 A1* | 5/2011 | Guan | H01L 29/0634 257/329 |
| 2012/0241766 A1* | 9/2012 | Ohtsuka | H01L 29/1608 257/77 |
| 2012/0319133 A1* | 12/2012 | Zhang | H01L 31/0312 257/77 |
| 2013/0323921 A1* | 12/2013 | Burke et al. | 257/E21.19 |

* cited by examiner

RADIATION-HARDENED POWER SEMICONDUCTOR DEVICES AND METHODS OF FORMING THEM

TECHNICAL FIELD

Embodiments described herein relate to radiation-hardened power semiconductor devices such as power MOSFETS or IGBTS and methods for manufacturing such semiconductor devices.

BACKGROUND

Power semiconductor devices, e.g., metal oxide field effect transistors (MOSFETs) such as double diffused metal oxide semiconductor (DMOS) transistors or insulated gate bipolar transistors (IGBTs), can suffer a permanent change in their electrical properties or can be destroyed if exposed to high-energy particle radiation or high-energy photon radiation.

There are three known major mechanisms that can lead to such a deterioration of a power semiconductor device. If ion-induced charges are separated by the electrical field of the reverse voltage, holes accumulate under the gate oxide due to the field geometry. When the breakdown voltage of the gate oxide is surpassed, in particular with negative gate-source voltage, a local breakdown of the gate oxide can result. If the integrity of the gate oxide (GOX) is locally destroyed the gate leakage current can rise and the control effect of the gate may be lost. This phenomenon is called Single Event Gate Rupture (SEGR).

Ion-induced avalanche generation, caused by a heavy ion impact from the radiation which creates a local, very high density electron-hole plasma, can lead to a short, but high current pulse under an applied reverse voltage. The high concentration of charge carriers results in a change of the electrical field with a steepening near the $n^+$-doped drain region of the substrate. If avalanche generation occurs the holes flow back to the source contact and can activate the parasitic bipolar transistor (BIP), leading to a self-sustained, destructive process (second breakdown). Such a local, massive damage to the silicon substrate can lead to a rise of the source-drain leakage current, and even to the complete loss of the drain-source blocking capability. This phenomenon is called Single Event Breakdown (SEB). SEGR and SEB together will be referred to as Single Event Effect (SEE).

A third mechanism is the charging of the gate oxide with positive charge through ionizing radiation. This phenomenon is called Total Ionizing Dose (TID) effect. In contrast to SEB and SEGR effects, TID effects does not lead to the destruction of the device, but to a drift of its electrical parameters, especially the threshold voltage.

There exist some conventional approaches for making a power semiconductor device more resistant to radiation. For example, for radiation-hardening the device against SEB, it has been suggested not to use an $n^-/n^+$-backside contact or to lower the source doping; against TID to reduce the thickness of the gate oxide; and against SEGR to increase the thickness of the gate oxide in contradiction to the TID-hardening measure, or to narrow the width of the neck regions between the body regions. The known approaches typically deteriorate electrical parameters of the power semiconductor devices such as the important drain to source resistance in on-state $R_{DS(on)}$, and have partially been suggested for devices which could not reach a low on-state resistance $R_{DS(on)}$.

In view of the above, there is a need for improvement.

SUMMARY

According to an embodiment, a method of forming a power semiconductor device is provided. The method includes providing a semiconductor substrate and forming an epitaxial layer on the semiconductor substrate. The epitaxial layer includes a body region, a source region, and a drift region. A dielectric layer is formed on the epitaxial layer. The dielectric layer is formed thicker above a drift region of the epitaxial layer than above at least part of the body region and the dielectric layer is formed at a temperature less than 950° C.

According to another embodiment, a method of forming a power semiconductor device is provided. The method includes providing a semiconductor substrate and forming an epitaxial layer above the semiconductor substrate. The epitaxial layer includes a body region, a drift region, and a superjunction structure. An upper superjunction zone of the superjunction structure arranged below the body region has a higher first-type doping than a lower superjunction zone of the superjunction structure below the upper superjunction zone and/or an upper drift zone of the drift region laterally adjacent to the upper superjunction zone is formed with a higher second-type doping than a lower drift zone below the upper drift zone. Therein, the difference between the first-type net doping dose of the upper superjunction zone and the second-type net doping dose of the upper drift zone is larger than the difference between the first-type net doping dose of the lower superjunction zone and the second-type net doping dose of the lower drift zone.

According to another embodiment, a method of forming a power semiconductor device is provided. The method includes providing a semiconductor substrate, and forming an epitaxial layer above the semiconductor substrate. The epitaxial layer includes a buffer layer arranged directly above the semiconductor substrate. The buffer layer has a second-type doping that decreases in the direction from the semiconductor substrate to the epitaxial layer.

According to another embodiment, a power semiconductor device is provided. The power semiconductor device includes a semiconductor substrate and an epitaxial layer above the semiconductor substrate, the epitaxial layer including a body region, a source region forming a pn-junction with the body region, and a drift region. The power semiconductor device further includes a dielectric layer above the epitaxial layer, and a gate electrode above the dielectric layer for controlling an inversion channel in the body region between the source region and the drift region. At least the source region is connected to a source electrode, and the substrate is connected to a drain electrode. The dielectric layer is thicker above the drift region than above at least part of the body region. The dielectric layer has a specific micro-structure as obtained by forming the dielectric layer with a low-temperature process at a temperature less than 950° C. The power semiconductor device may include a p-doped superjunction structure formed in the epitaxial layer, wherein the body region is connected to the superjunction structure.

According to a further embodiment, a power semiconductor device is provided. The power semiconductor device includes a semiconductor substrate and an epitaxial layer above the semiconductor substrate. The epitaxial layer includes a first-type doped superjunction structure, a body region connected to the superjunction structure, a source region forming a pn-junction with the body region, and a second-type doped drift region. The semiconductor device further includes a dielectric layer above the epitaxial layer, and a gate electrode above the dielectric layer for controlling an inversion channel in the body region between the source region and the drift region. At least the source region is connected to a source electrode, and the substrate is connected to a drain electrode. An upper superjunction zone of the superjunction structure below the body region contains a higher first-type doping than a lower superjunction zone of the superjunction structure below the upper superjunction zone and/or an upper drift zone of the drift region laterally adjacent to the upper superjunction zone contains a higher second-type doping than a lower drift zone of the drift region below the upper drift zone. The difference between the first-type net doping dose of the upper superjunction zone and the second-type net doping dose of the upper drift zone is larger than the difference between the first-type net doping dose of the lower superjunction zone and the second-type net doping dose of the lower drift zone.

According to another embodiment, a power semiconductor device is provided. The power semiconductor device includes a semiconductor substrate and an epitaxial layer above the semiconductor substrate. The epitaxial layer includes a body region, a source region forming a pn-junction with the body region, a drift region, and a buffer layer arranged directly above the semiconductor substrate. The power semiconductor device further includes a dielectric layer above the epitaxial layer, and a gate electrode above the dielectric layer for controlling an inversion channel in the body region between the source region and the drift region. At least the source region is connected to a source electrode, and the substrate is connected to a drain electrode. The buffer layer has a second-type doping that decreases in the direction from the semiconductor substrate to the epitaxial layer. The power semiconductor device may include a p-doped superjunction structure formed in the epitaxial layer, wherein the body region is connected to the superjunction structure.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
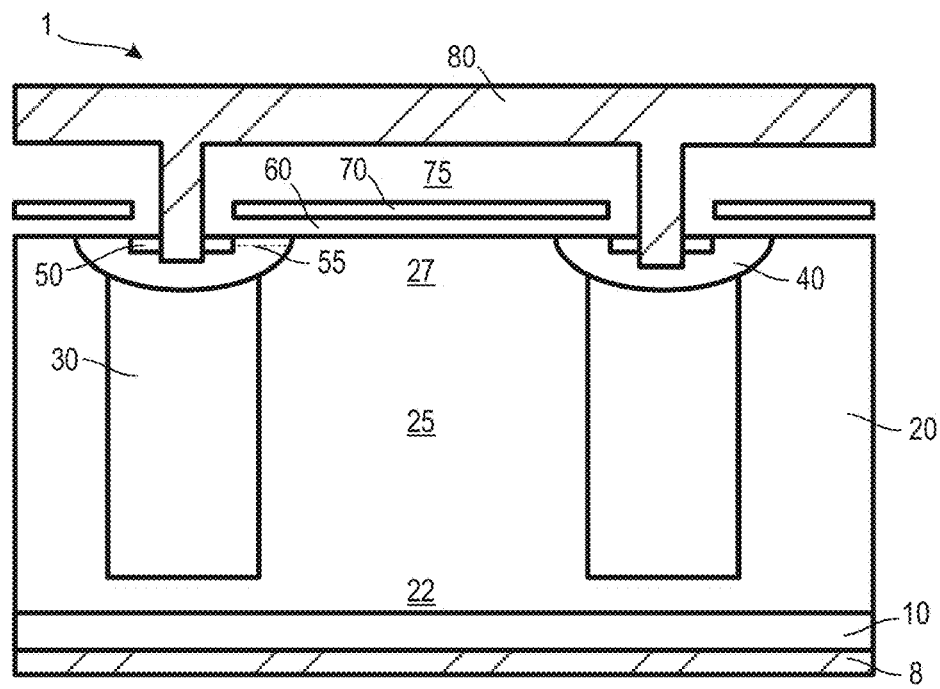
FIG. 1 shows a power semiconductor device in cross-section.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims. The embodiments can be combined unless noted otherwise. The drawings are not drawn to scale.

The term "lateral" as used in this specification intends to describe an orientation parallel to a first main surface of a semiconductor substrate.

The term "vertical" as used in this specification intends to describe an orientation, which is arranged perpendicular to the first surface of the semiconductor substrate. The term "vertical power semiconductor device" shall signify a power semiconductor device in which the drift of charge carriers in the drift zone is vertical, i.e., perpendicular to the first surface of the semiconductor substrate.

In this specification, a second surface of a semiconductor substrate is considered to be formed by the lower or backside surface while the first surface is considered to be formed by the upper, front or main surface of the semiconductor substrate. The terms "above", "upper", "uppermost", "over", "on", and "below", "lower" "lowermost", and "under" as used in this specification therefore describe a relative spatial location of a structural feature to another structural feature with consideration of this orientation. The terms "directly above", "directly over", "directly on", "directly below", "directly under", "adjacent" and "connecting/connected", when used with respect to two layers, films, regions, sections, zones or other elements shall signify that these objects contact each other at least physically.

Reference is made in the following description to power semiconductor devices having an n-type doping of the substrate, the drift region and the source region, and a p-type doping of the body region and of a superjunction structure, if present. The effects of SEE and TID are most pronounced in such power semiconductor devices, so they benefit the most from the measures described herein. However, it shall be understood that the doping could be inversed, and a first-type doping and an opposite second-type doping may replace the specific p-type doping and the opposite n-type doping described hereinafter. Further, the description concentrates on single cells of power semiconductor device, therefore making reference, e.g., to a body region, a source region, a drift region etc. It shall be understood that a power semiconductor device typically includes many such cells, including many body regions, source regions, drain regions etc.

FIG. 1 shows a power semiconductor device 1 in the form of a vertical power MOSFET. The semiconductor device includes a semiconductor substrate 10, having a first surface and a second surface and acting as an n$^+$-doped drain region of the semiconductor device 1. A drain electrode 8 is formed on the second surface. The semiconductor substrate 10 may be, e.g., a Si, SiC, GaN or GaAs substrate.

An n-doped epitaxial layer 20 is formed on the first surface of the semiconductor substrate 10. The n-doped epitaxial layer 20 may include a base epitaxial layer 22. A superjunction structure is formed in the epitaxial layer 20 by one or multiple implantation and diffusion processes. The superjunction structure includes a p-doped column 30 and an n-doped column 25 of the epitaxial layer 20, wherein the relative dose of the p-doped column 30 and of the n-doped column 25 maintains a compensation condition, i.e., the difference of the integrated p-dose and n-dose per laterally extending layer is less than $2 \times 10^{12}$ cm$^{-3}$. In other words, the net doping dose or relative doping dose is less than $2 \times 10^{12}$ cm$^{-3}$. An uppermost drift zone 27 between p-doped body regions 40 is called neck zone. The p-doped body region 40 and an n-doped source region 50 are formed in the epitaxial layer 20 by implantation and diffusion.

A gate oxide layer 60 is formed on the epitaxial layer 20, e.g., by oxidizing an upper surface of the epitaxial layer 20. A gate electrode 70 is formed on the gate oxide layer 60. The gate electrode 70 controls an inversion channel 55 in the body region 40 between the source region 50 and the neck region of the uppermost drift zone 27. An intermediate insulation layer 75 is formed between the gate electrode 70 and a source electrode 80. The source electrode 80 electrically contacts both the source region 50 and body region 40 via a contact hole.

According to embodiments of the present invention, measures for radiation-hardening of a semiconductor device will be described. These measures may be used alone or in conjunction with one or more of the others. Accordingly, one or more embodiments described with respect to one measure may be combined with other embodiments relating to another measure or other measures to yield yet further embodiments.

Low-Temperature Formed CAPOX

As a first measure, the dielectric layer 60 between the gate electrode 70 and the epitaxial layer 20 may be formed thicker above the n-column 25, in particular above the neck region 27, than above at least part of the body region 40. The dielectric layer 60 may be thicker in a part closer to the neck region 27 than in a part closer to the source region 50. The thicker part of the dielectric layer 60 may therefore only cover the drift region of the n-column 25 or may cover both the drift region of the n-column 25 and a part of the body region 40.

The dielectric layer 60 may be formed by a local process in the areas that will become the thicker parts, e.g., a local oxidation of silicon (LOCOS) process that uses a mask, and a subsequent global process of gate oxidation. The part or sub-layer of the dielectric layer 60 formed by the local process will be referred to as a cap oxide layer (CAPOX) and the thinner, globally formed part as a gate oxide layer (GOX). Typically, CAPOX and GOX are silicon oxide layers.

The entire dielectric layer 60 is formed in a low-temperature process at temperatures lower than 950° C., or lower than 920° C. or even lower than 900° C. All subsequent processes are also low-temperature processes, like the formation of the gate electrode 70 and intermediate insulating layer 75, and including implantation, annealing and activation steps. High-temperature processes such as the diffusion of the source and body regions 50, 40 are performed previously. Low-temperature formation of the dielectric layer 60 leads to structural differences compared to a dielectric layer formed in a high-temperature process. The trap density for charge carriers is higher in the bulk of the dielectric layer 60, but lower at the boundary to the epitaxial layer 20 for the low-temperature formed dielectric layer 60. Fewer holes will accumulate at this interface. This is probably due to recombination since the electrons are hindered in reaching the gate electrode 70. Therefore, the feature of a dielectric layer 60 as formed in, or obtained from, a low-temperature process at temperatures lower than 950° C. is a structural feature expressing the microstructural differences in functional terms.

A dielectric layer 60 according to such embodiments improves the resistance to both SEGR and TID effects, i.e., it hardens the semiconductor device at least against SEGR and TID effects. The thicker part of the dielectric layer 60 at least above the neck region 27 reduces the electric field across the dielectric layer 60 in this part, increasing the breakdown field strength of the dielectric layer 60. The negative effects of ion-induced holes being transported from the neck region 27 or other n-doped drift zones to the boundary of the epitaxial and dielectric layer 20, 60 is suppressed since the areas potentially endangered by gate rupture are shielded. This counteracts a local breakdown due to SEGR effects. When the thicker part of the dielectric layer 60 overlaps a part of the body region 40, the additional advantage is provided that holes created in the drift region can be effectively guided via the body region 40 to the source 50. In this way they do not reach the interface to the dielectric layer 60 in those parts where the dielectric layer 60 is thin and where they would constitute a threat to the integrity of the dielectric layer 60. Since the traps for charge carriers in the dielectric layer 60 at the boundary to the epitaxial layer 20 is reduced, the device becomes TID-hardened, probably due to the above-described recombination effect. While such a dielectric layer 60 with its particular microstructure created through the low-temperature process conditions might normally be considered inferior, it provides an advantage for radiation-hardening the device.

Figure 2:
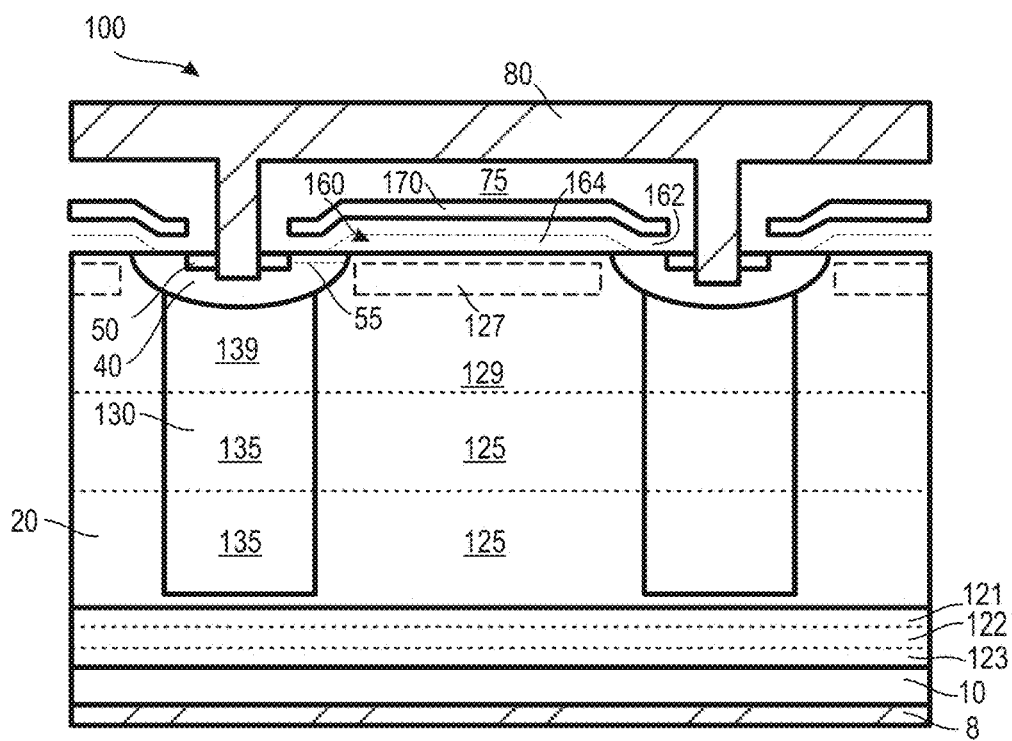
FIG. 2 shows a power semiconductor device according to embodiments.

FIG. 2 shows a vertical power semiconductor device 100 including a dielectric layer 160 according to an embodiment of the invention. The dielectric layer 160 includes a cap oxide layer 164, formed above a neck region or uppermost drift zone 127 and above a part of the body region 40 that is adjacent to the neck region 127. The dielectric layer 160 further includes a gate oxide layer 162 formed above the cap oxide layer 164 and the body region 40. The gate electrode 170 formed above the dielectric layer 160 controls the inversion channel 55 in the body region 40 between the source region 50 and the neck region 127. The doping of the inversion channel 55 is higher near the source 50 than near the neck region 127, so the threshold voltage and the switching properties are mainly determined by the thin part of the dielectric layer 160 near the source 50, i.e., in the part of the dielectric layer 160 where no cap oxide is present. The beginning of the cap oxide layer 160 may therefore be formed in a considerable part above the trailing end of the body region 40 close to the neck region 127 without substantially disturbing the switching properties.

Figure 3:
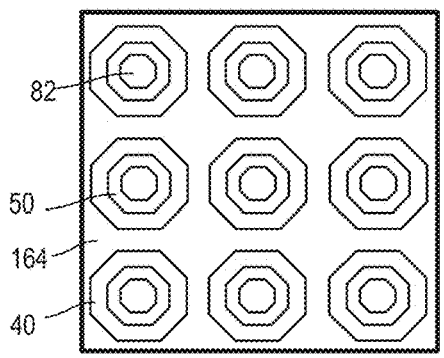
FIGS. 3-6 illustrates layouts of a cap oxide layer according to embodiments.
Figure 4:
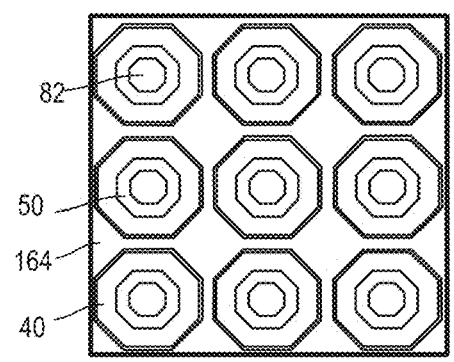
Figure 5:
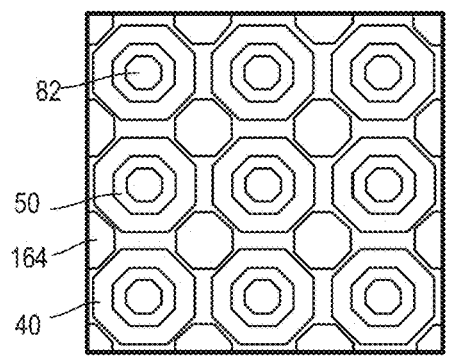
Figure 6:
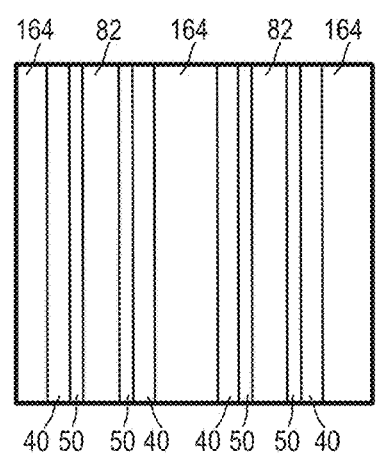

FIG. 3 shows the geometry of a cap oxide layer 164 of a vertical power semiconductor device with octagonal cells. The cap oxide layer 164 overlaps the body region 40 ("large CAPOX"). The source region 50 has a contact hole 82 in the center for a source electrode to contact the body and source regions 40, 50 through the contact hole 82. FIG. 4 is similar to FIG. 3, but the cap oxide layer 164 does not overlap the body region 40 ("medium CAPOX"). In FIG. 5, the cap oxide layer 164 has a smaller extension than in FIG. 4 and only covers areas in the diagonals of the cells. FIG. 6 shows a stripe geometry of a vertical power semiconductor device wherein the cap oxide layer 164 overlaps the body region 40.

Figure 7:
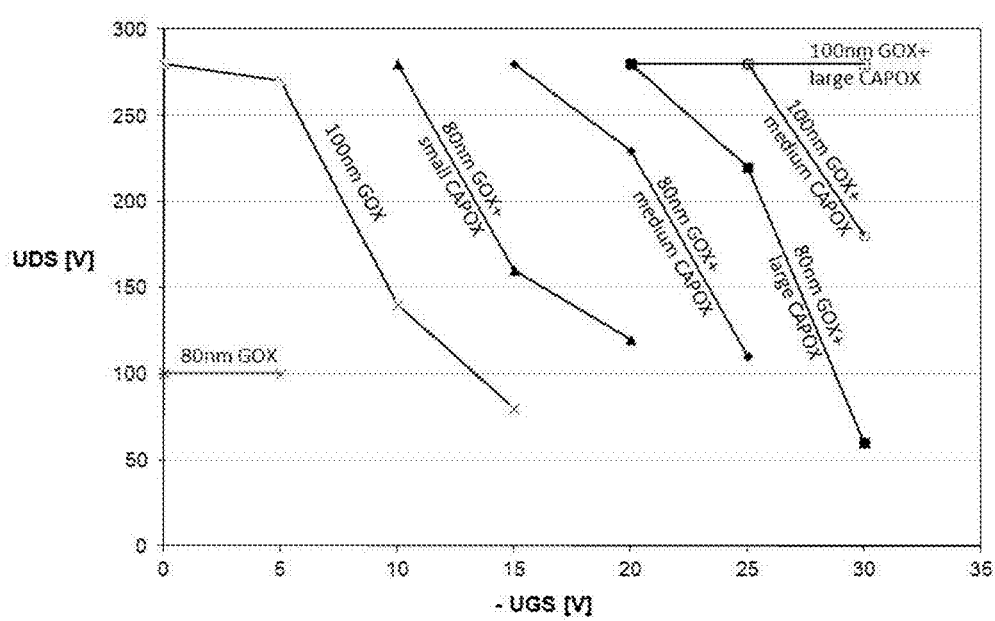
FIG. 7 illustrates the effects of cap oxide layers as shown in FIGS. 3-5 and for gate oxide layers of various thicknesses.

FIG. 7 demonstrates the SEGR-hardening of semiconductor devices with different gate oxide thicknesses and cap oxide extensions in the lateral direction. The radiation was xenon with linear energy transfer LET=56 MeV×cm$^2$/mg and a penetration depth of 43 μm. Layouts with "small CAPOX" have a lateral CAPOX extension that is smaller by 400 nm per edge than Layouts with "large CAPOX". Layouts with "medium CAPOX" have a CAPOX extension that is smaller by 200 nm per edge than Layouts with "large CAPOX". The negative gate-source voltage $-U_{GS}$ is plotted against the drain-source voltage $U_{DS}$. The threshold for SEGR depends both on the gate-source voltage and on the drain-source voltage. The curves show a clear SEGR-hardening for thicker low-temperature formed gate oxide layers and for CAPOX layers with larger lateral extension, the safe operating area becoming larger for layouts with thicker low-temperature formed gate oxide and larger lateral extension of the CAPOX.

Figure 8:
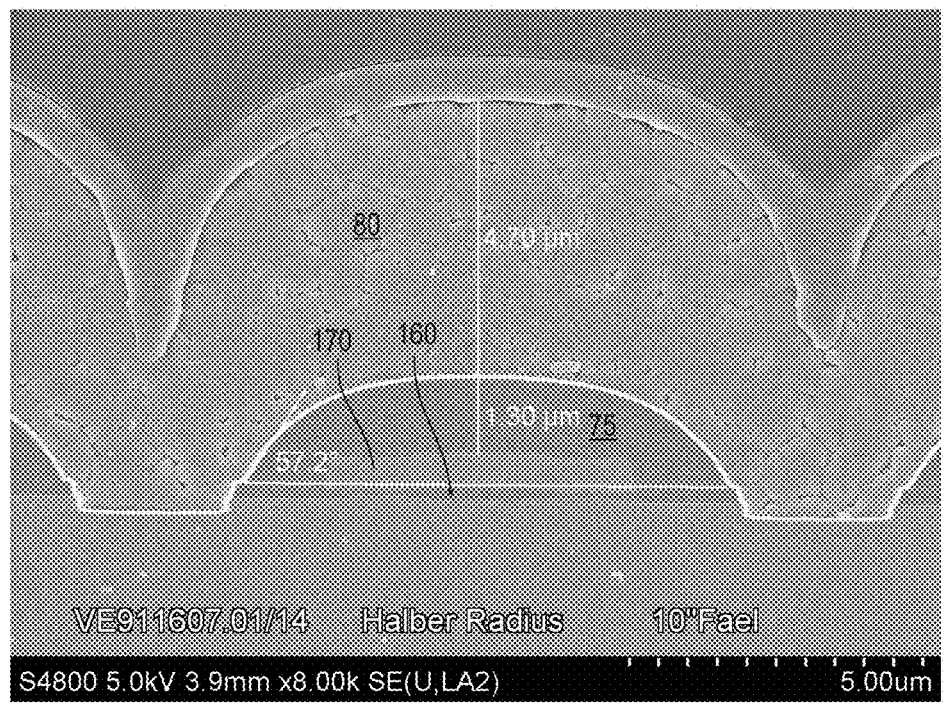
FIGS. 8-9 show photographs of a power semiconductor device according to an embodiment.
Figure 9:
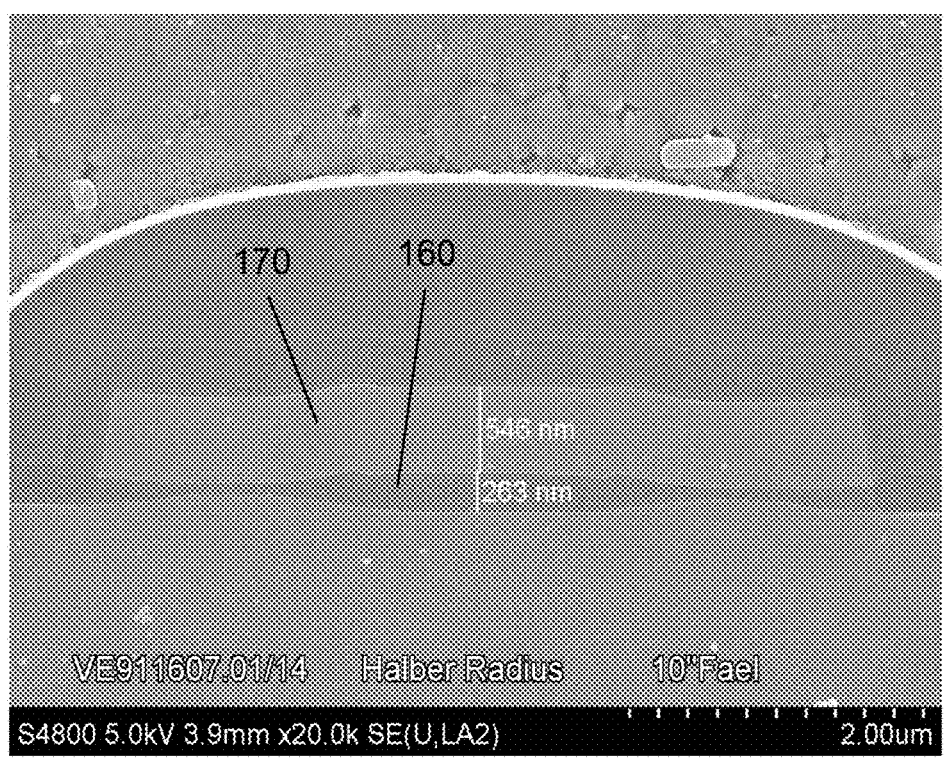

FIG. 8 shows an embodiment wherein the thickness of the source electrode 80 is 4.70 μm in the vertical direction, and the intermediate isolation layer 75 has a thickness of 1.30 μm. FIG. 9 shows an enlarged part of FIG. 8. The thickness of the gate electrode 170, a polysilicon electrode, is 546 nm, and the thickness of the dielectric layer 160 at its thick part where a cap oxide was formed is 263 nm.

Figure 10:
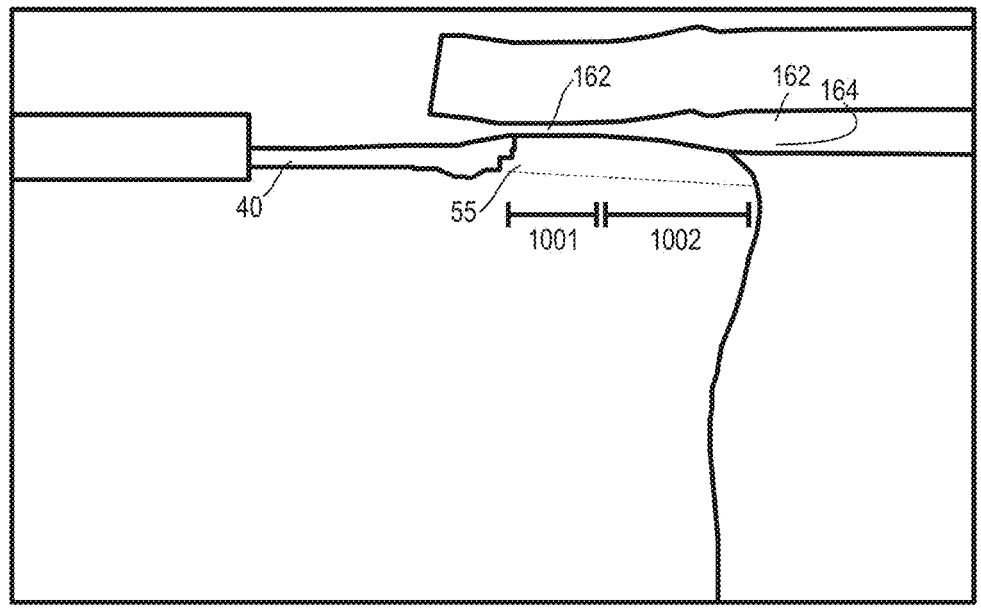
FIG. 10 shows a power semiconductor device with a dielectric layer according to an embodiment.

FIG. 10 illustrates an embodiment similar to FIGS. 7 and 8. The lateral length of the thin part 1001 of the dielectric layer 160 is less than the lateral length of the thicker part 1002 of the dielectric layer 160, where, in addition to the gate oxide layer 162, a cap oxide layer 164 has previously been formed. The lateral length 1001 may, e.g., be about 0.6 μm, and the lateral length 1002 may, e.g. be about 0.9 μm. The thicknesses of the gate oxide and cap oxide layers 162, 164 may generally depend on the desired nominal voltage of the device, and increase as the nominal voltage increases.

Improved Superjunction

As a second measure, a modified superjunction structure with improved resistance to SEGR and SEB effects may be provided (SEE-hardening). In the modified superjunction structure, the compensation condition is violated on purpose in an upper part of the superjunction structure, and only maintained in a lower part. More specifically, the relative doping in lower zones, i.e., the difference of the net doping doses of n-type and p-type dopants, integrated in the horizontal layers of the respective zones, is still substantially zero in the lower zones (smaller than 2×10$^{12}$ cm$^{-3}$).

The absolute doping dose of one or more upper superjunction zones of the p-doped superjunction structure may be higher than in one or more lower superjunction zones. Additionally, the absolute doping dose of one or more upper drift zones of the n-doped drift region may be higher than in one or more lower drift zones below the one or more upper drift zones. When both the absolute doping dose of the upper superjunction zone(s) and the absolute doping dose of the upper drift zone(s) are higher, this is advantageous for decreasing the on-state resistance $R_{DS(on)}$.

In the upper superjunction zone(s) and the upper drift zone(s), the relative doping is larger. Typically the p-type net doping dose of the upper superjunction zone(s) will be larger than the n-type net doping dose of the upper drift zone(s). The plane in which the p-doping and n-doping violate the compensation condition extends typically into a depth of 5 μm or even more under the upper surface of the epitaxial layer, i.e., under the boundary of the epitaxial layer and the dielectric layer.

Directly under the dielectric layer, in particular in the neck region, the electrical field strength is lowered by this measure. Multiplication of ion-induced electron-hole pairs close to the gate oxide is reduced under these conditions, and the accumulation of holes under the gate oxide is also reduced. An improved superjunction structure thus hardens the semiconductor device against SEE effects.

The p-doping and the n-doping in the p-column and n-column, respectively, can be chosen such that the p-doped upper superjunction zone(s) are not depleted when reverse voltage is applied to the power semiconductor device and lie on source potential. The absolute p-doping and n-doping of the upper zone(s) may be increased as much as desired to lower the on-state resistance, a limit being given by the fact that at some point the lateral field strength components will be so high that the field strength at the upper surface of the n-drift zone will increase again and resistance to SEE effects will be lowered.

FIG. 2 shows a semiconductor device 100 with an improved superjunction structure. The drift region includes two lower drift zones 125, an upper drift zone 129, and an uppermost drift zone or neck region 127 below the dielectric layer 160. The superjunction 130 includes two lower superjunction zones 135, and an upper superjunction zone 139 directly below the body region 40. The p-type net doping dose of the lower superjunction zones 135 and the n-type net doping dose of the lower drift zones 125 keep the compensation condition. This causes a complete depletion of charge carriers even at low voltages in reverse direction, and the ensuing high blocking capability is independent of the absolute n-doping of the entire drift zone. Therefore, the doping may be increased to lower the on-state resistance $R_{DS(on)}$. The p-doping of the upper superjunction zone 139 is larger than the p-doping of the lower superjunction zones 135. The n-doping of the upper drift zone 129 may also be larger than the n-doping of the lower drift zones 125. The p-type net doping dose of the upper superjunction zone 139 is also larger than the n-type net doping dose of the upper drift zone 129, deliberately violating the compensation condition in order to improve resistance against SEE effects.

Figure 11:
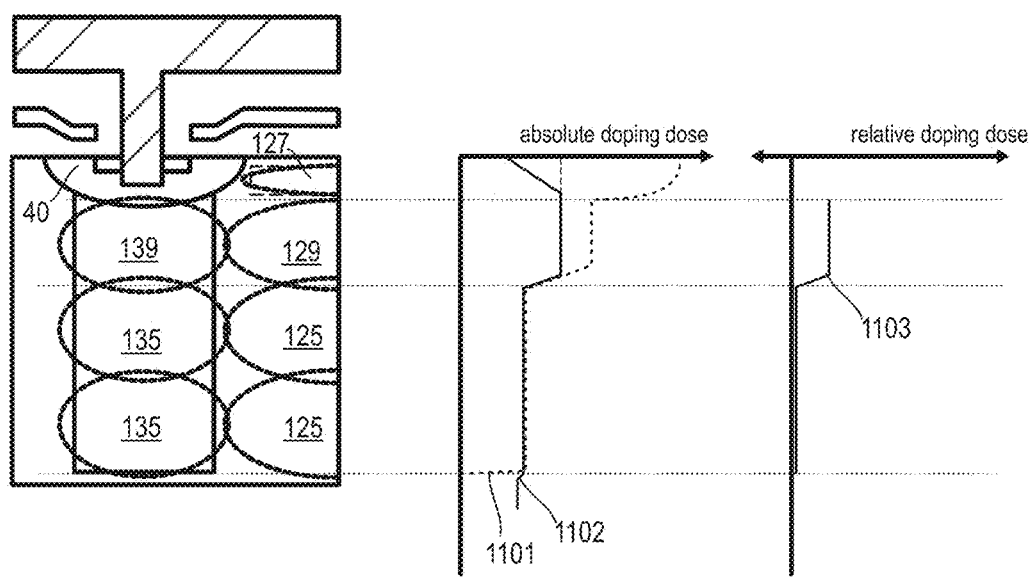
FIG. 11 illustrates absolute and relative doping concentrations in a superjunction structure and a drift zone of a power semiconductor device according to embodiments.

FIG. 11 shows a cutout from FIG. 2, illustrating the formation of the superjunction and drift zones. The different zones may be formed by multiple processes of epitaxy and implantation and diffusion of the dopants, leading to the 'bubbles' shown in FIG. 11 which represent the improved superjunction structure and drift region. The graphs on the right schematically show the absolute and relative doping dose profiles through the center of the bubbles and therefore of the centers of the p-column and n-column. In the lower zones, net p-doping dose and net n-doping dose are substantially the same to keep the compensation condition, so the relative doping dose is substantially zero. In the upper zones, the absolute doping is higher, and the relative doping dose violates the compensation condition with the p-type net doping dose being higher than the n-type net doping dose by a substantial amount. These relations are reflected by the schematic curve for absolute p-doping dose 1101, the schematic curve for absolute n-doping dose 1102, and the relative doping dose 1103 in FIG. 11.

Figure 12:
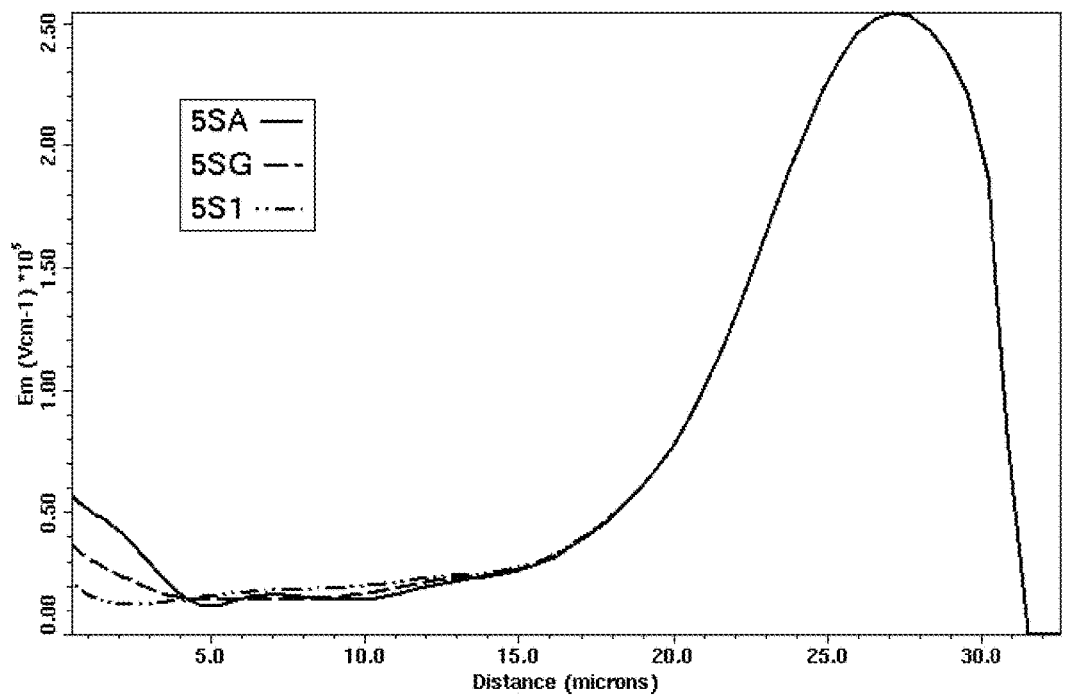
FIG. 12 shows simulated plots of depth profiles of the electrical field in power semiconductor devices according to embodiments.

FIG. 12 shows simulated depth profiles of the electric field, where depth is measured from the border of the epitaxial layer with the dielectric layer (depth=0 at the left sides in the plots) vertically down into the epitaxial layer (depth>0 towards the right sides of the plots). The curves represent depth profiles at the center of the drift zone in the n-column. The simulations relate to CoolMOS chips modified by the improved superjunction structure described herein. The different curves relate to a variant of a power MOSFET referenced as '5S1' with breakdown voltage BVDSS=286.8V, and on-state resistance $R_{DS(on)} \times A=1.93$ $\Omega\text{mm}^2$ (dashed-dotted line), to a variant of a power MOSFET referenced as '5SG' with breakdown voltage BVDSS=287.4V, and on-state resistance $R_{DS(on)*A}=1.59$ $\Omega\text{mm}^2$ (dashed line), and to a variant of a power MOSFET referenced as '5SA' with breakdown voltage BVDSS=288.4V, and on-state resistance $R_{DS(on)}*A=1.39$ $\Omega\text{mm}^2$ (solid line). The plots show that the electrical field is considerably lowered in the drift region near the interface to the dielectric layer, so that devices with low on-state resistance such as the variant '5SA' can be achieved.

Figure 13:
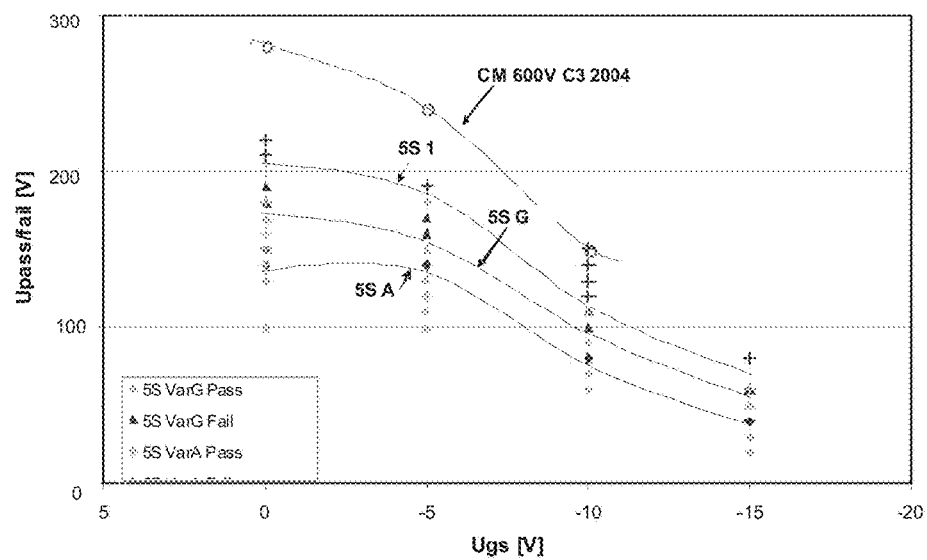
FIGS. 13-14 illustrate the effects of a superjunction structure and a drift zone modifying the electrical field as shown in FIG. 12 in a power semiconductor device according to embodiments.
Figure 14:
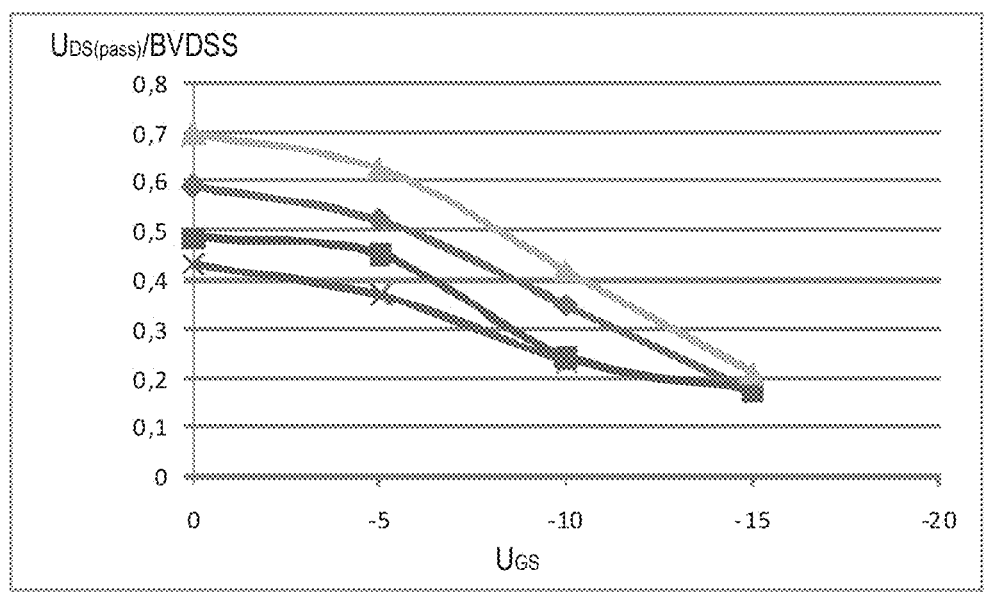

FIGS. 13 and 14 show the results of radiation tests with 132 xenon, LET=55 MeV cm$^2$/mg, penetration depth=43 µm, carried out on the MOSFET variants 5S1, 5SG and 5SA of FIG. 12 in comparison to a conventional 600V CoolMOS with measured BVDSS of over 700 V and significantly higher, i.e., worse $R_{DS(on)} \times A=3.8$ $\Omega\text{mm}^2$. In FIG. 13, the drain-source voltage is plotted against the gate-source voltage, and the curves illustrate the boundary between passing and failing the SEE resistance test. Measurement points above the curve indicate failure, measurement points below indicate passing of the test. The reduction of the electrical field close to the dielectric layer is largest for variant 5S1, followed by 5SG, 5SA and the standard CoolMOS. FIG. 14 shows the SEE-hardening in relation to the reached breakdown voltage BVDSS. The improved devices 5S1, 5SG and 5SA exhibit a significantly better resistance to SEE effects than the standard CoolMOS. Further, the dependence of the SEE-hardening on the amount of field reduction of the electrical field in the upper zones near the dielectric layer is clearly visible. The lower the electrical field close to the boundary between the epitaxial layer and the dielectric layer the higher is the resistance to SEE.

In the embodiment with improved superjunction described above, the CAPOX measure has not been implemented. According to further embodiments, both measures can be implemented to increase the resistance to SEE and TID even more.

Buffer Layer with Non-Constant Doping

As a third measure, a buffer layer may be provided in the base epitaxial layer. The buffer layer may comprise one or more epitaxial layers, wherein the doping concentration of n-dopants increases in the direction towards the n$^+$-doped semiconductor substrate, and decreases in the opposite direction towards the body, the source and the gate. The buffer layer may be grown on the semiconductor substrate as a single layer wherein the dopant concentration is lowered in the course of the epitaxial process. Alternatively, two or more sub-layers may be grown, each with a lower doping than the one before.

Through such a non-constant doping, the electrical field can penetrate into upper sub-layer(s) of the buffer layer at high current densities induced by ion events. Thereby, a steepening of the field at the backside of the n$^+$-substrate is reduced. The higher doped lower sub-layer(s) of the buffer layer reduce an increase of the on-state resistance $R_{DS(on)}$ and prevent that a field peak is dynamically created between the higher sub-layer(s) with low n-doping and the highly doped n$^+$-substrate. The thickness and doping of the buffer layer may be chosen such that the on-state resistance $R_{DS(on)}$ does not substantially increase.

FIG. 2 shows an embodiment of a semiconductor device with a buffer layer directly above the semiconductor substrate 10, the buffer layer having three sub-layers 121, 122 and 123. The sub-layer 123 is higher doped than the sub-layer 122, which in turn is higher doped than the sub-layer 121.

An embodiment with a buffer layer of non-constant doping may be combined with embodiments having the improved superjunction and/or with embodiments having the CAPOX measure described herein. Embodiments implementing one, two or all three measures, e.g., the power semiconductor shown in FIG. 2, exhibit an even further increased resistance to SEE and TID while maintaining a low on-state resistance.

Additionally to any of the measures of forming a cap oxide layer, forming an improved superjunction and/or forming a buffer layer with non-constant doping, the n-doping may be increased in the uppermost drift zone directly below the dielectric layer, i.e., in the neck region. To increase the n-doping concentration, the doping of the epitaxial layer may be increased while the epitaxial layer is grown or an additional dose of n-dopants may be implanted and diffused.

Forming a higher-doped neck region is particularly advantageous in combination with forming the improved superjunction. Since the electrical field is lowered in the upper plane(s) formed by the upper superjunction zone(s) and upper drift zone(s), and in particular is almost field-free in the uppermost plane directly under the dielectric layer due to the improved superjunction structure, the n-doping can be increased in the neck region without increasing the electrical field too much, so the radiation-hardening is kept. At the same time, the higher n-doping in the neck region reduces the on-state resistance. By combining the improved superjunction and the formation of a higher-doped uppermost drift zone, the electrical field under the dielectric layer can be optimized for radiation-hardening and, almost independently thereof, the on-state resistance can be optimized.

FIG. 2 shows a semiconductor device 100 including an uppermost drift zone 127 with n-doping higher than the n-doping of the lower drift zones 125. FIG. 9 shows an embodiment where the higher-doped uppermost drift region 127 has been formed by implantation and diffusion. The n-doping 902 schematically shown for the center of the n-column on the right of FIG. 9 may, e.g., be substantially the same in the uppermost drift zone 127 and in the upper drift zone 129 as indicated by the dashed part of the line 902, while the full line at the level of the uppermost drift region shows an example of the n-doping concentration when the uppermost drift region is not higher-doped.

Instead of forming a cap oxide layer, or additionally to this measure, the gate electrode may be fully recessed above the n-column, i.e., above the drift zone, or may be fully recessed at least above parts of the n-column. In other words, there would be a gap in the gate electrode. This would again increase the resistance to SEGR since critical regions are further deactivated where, during an ion event, holes may be transported to the boundary between the neck region and the dielectric layer. The increase in the distributed gate resistance might have to be compensated, e.g., by forming thicker gate electrodes.

According to further embodiments, a method of forming a power semiconductor device is provided. For instance, the power semiconductor device may be a power MOSFET such as an NDMOS or may be an IGBT. The power semiconductor may be a vertical power semiconductor device.

The method includes providing a semiconductor substrate. The semiconductor substrate may be a silicon substrate, e.g., an $n^+$-doped silicon substrate. The semiconductor substrate has a first surface (front surface) and a second surface (back surface). The method may include forming a drain electrode on the second surface.

The method may include forming a buffer layer directly above or directly over the semiconductor substrate, i.e., on the first surface of the semiconductor substrate. The buffer layer may be grown by epitaxy. The buffer layer may include, e.g., the base materials Si and/or SiC. The buffer layer may include the following dopants: Ph, As, Se, thermic donators such as those created by proton impact, and combinations thereof. The buffer layer may form or be part of a base epitaxial layer. The buffer layer may be a single layer or include one or more sub-layers. The buffer layer may be formed with a doping, particularly an n-type doping, that decreases in the upward direction. The upward direction is the direction perpendicular to, and outward from, the first surface of the semiconductor substrate. Forming the buffer layer may include decreasing the doping concentration while forming the buffer layer. In this way a buffer layer with graded doping may be formed. The graded doping may be linear or substantially step-like. Forming the buffer layer may alternatively include forming a first sub-layer and at least one second sub-layer with different doping, e.g., forming a first, second, and third sub-layer.

The buffer layer may be formed to have at least one of the following characteristics. The zone of a graded buffer layer most remote from the semiconductor substrate, i.e., the uppermost zone of a graded buffer layer, may have a mean doping of $1\times10^{15}$ $cm^{-3}$ to $6\times10^{15}$ $cm^{-3}$, e.g., less than or equal to $4\times10^{15}$ $cm^{-3}$ or $3\times10^{15}$ $cm^{-3}$. A first sub-layer most remote from the semiconductor device may have a doping of $1\times10^{15}$ $cm^{-3}$ to $6\times10^{15}$ $cm^{-3}$, e.g., less than or equal to $4\times10^{15}$ $cm^{-3}$ or $3\times10^{15}$ $cm^{-3}$. The thickness of the first sub-layer or of the first zone may be at least 8 µm, at least 12 µm or at least 16 µm. The thickness of the entire buffer layer may be at least 12 µm, at least 20 µm or at least 24 µm. The doping may increase towards the substrate to reach typical substrate doping values, e.g., values of about $1\times10^{19}$ $cm^{-3}$.

The method includes forming an epitaxial layer. The epitaxial layer may include or consist of the following base materials: Si, SiC; GaN, GaAs, and combinations thereof. The epitaxial layer may include the following dopants: Ph, As, Se, thermic donators such as those created by proton impact, and combinations thereof as n-dopants, and B, Al Ga, and combinations thereof as p-dopants. The epitaxial layer may be formed above the buffer layer or, in the absence of a buffer layer, directly above the semiconductor substrate. The buffer layer may also be regarded as part of the epitaxial layer. The epitaxial layer may be generally n-doped. The epitaxial layer may be grown in the upward direction, and may include a base epitaxial layer and a structured part (including, e.g., superjunction structure). The upward direction may also be expressed as the direction from the semiconductor substrate to the epitaxial layer. The thickness of the base epitaxial layer may be at least 12 µm, at least 20 µm or at least 24 µm.

Forming the epitaxial layer may include forming a superjunction structure in the epitaxial layer. The superjunction structure may include a p-column formed in the epitaxial layer, while an n-column may be formed laterally adjacent thereto, forming a drift region of the semiconductor device. The superjunction structure may include at least two p-doped superjunction zones, forming a vertical p-column. The drift region may include at least two n-doped drift zones, forming a vertical n-column. Each zone may be formed by implantation of the corresponding type of dopant and subsequent diffusion.

An upper superjunction zone or upper superjunction zones of the superjunction structure may be formed with a higher p-type doping than at least one lower superjunction zone of the superjunction structure below the upper superjunction zone. Two or more upper superjunction zones may be formed, including a first upper superjunction zone directly below a body region to be formed at a later stage. Two, three, four or more lower superjunction zones may be formed. An upper drift zone or upper drift zones laterally adjacent to the upper superjunction zone(s) may be formed with a higher n-type doping than at least one lower drift zone below the upper drift zone. There may be two or more upper drift zones formed laterally adjacent to corresponding upper superjunction zones. Two, three, four or more lower drift zones may be formed laterally adjacent to corresponding lower superjunction zones.

The difference between the n-type net doping dose of the upper drift zone(s) and the p-type net doping dose of the upper superjunction zone(s), i.e., the relative doping dose between the upper drift zone(s) and upper superjunction zone(s), may be larger than the difference between the n-type net doping dose of the lower drift zone(s) and the p-type net doping dose of the lower superjunction zone(s), i.e., the relative doping between the lower drift zone(s) and the lower superjunction zone(s).

The absolute doping dose of the upper superjunction zone(s) may be at least 10%, 20%, 30%, 50% or 100% higher than the absolute doping dose of the at least one lower superjunction zone. The absolute doping dose of the upper superjunction zone(s) may be at least twice, three times, four times, five times, ten times or more that of the absolute doping dose of the at least one lower superjunction zone. The absolute doping dose of the upper drift zone(s) may be at least 10%, 20%, 30%, 50% or 100% higher than the absolute doping dose of the at least one lower drift zone. The absolute doping dose of the upper drift zone(s) may be at least twice, three times, four times, five times, ten times or more that of the absolute doping dose of the at least one lower drift zone.

The zones of the superjunction and of the drift region, i.e., of a p-column and of an n-column in the epitaxial layer may be formed in the following way. The difference between the n-type net doping dose of the upper drift zone and the p-type net doping dose of the upper superjunction zone, i.e., the relative doping dose between said upper zones, may be at least 50%, 100%, 200%, 300%, 400% or 500% larger than the difference between the n-type net doping dose of the lower drift zone(s) and the p-type net doping dose of the lower superjunction zone(s), i.e., the relative doping dose between the said lower zones.

The difference between the n-type net doping dose of the lower drift zone(s) and the p-type net doping dose of the lower superjunction zone(s) may be substantially zero, in particular lower than $2\times10^{12}$ cm$^{-2}$, or even lower than $1\times10^{12}$ cm$^{-2}$. The difference between the n-type net doping dose of the lower drift zone(s) and the p-type net doping dose of the lower superjunction zone(s) may be such that the charge compensation condition is met. The difference between the n-type net doping dose of the upper drift zone(s) and the p-type net doping dose of the upper superjunction zone(s) may be higher than $2\times10^{12}$ cm$^{-2}$, $3\times10^{12}$ cm$^{-2}$, $1\times10^{13}$ cm$^{-2}$, or higher than $5\times10^{13}$ cm$^{-2}$, $10^{14}$ cm$^{-2}$, or even $10^{15}$ cm$^{-2}$. The difference between the n-type net doping dose of the upper drift zone(s) and the p-type net doping dose of the upper superjunction zone(s) may be such that the charge compensation condition is violated. Net doping doses are integrated doses.

Forming the upper superjunction zone may include implanting a first dose of a dopant. The first implant dose may be from $10^{11}$ cm$^{-2}$ to $10^{17}$ cm$^{-2}$ of a p-type dopant, typically from $10^{11}$ cm$^{-2}$ to $10^{15}$ cm$^{-2}$ of the p-type dopant. The p-type dopant may, e.g., be B, Al, Ga and combinations thereof. Forming the upper drift zone may include implanting a second dose of a dopant. The second implant dose may be from $10^{11}$ cm$^{-2}$ to $10^{17}$ cm$^{-2}$ of an n-type dopant, typically from $10^{11}$ cm$^{-2}$ to $10^{15}$ cm$^{-2}$ of the n-type dopant. The n-type dopant may, e.g., be Ph, As, Se, thermic donators, and combinations thereof. The doping dose of the finally formed p-column and n-column, i.e., the integrated doses measured along the vertical middle line through the p-column and n-column, respectively, may be in the same or a similar range. The doping may be different within two or more upper superjunction zones, or within two or more lower superjunction zones. The doping may be different within two or more of the upper drift zones, or within two or more of the lower drift zones. The upper drift zone as well as the upper superjunction zone, or the upper drift zone plus the uppermost drift zone as well as the upper superjunction zone plus the body region, may have a thickness of at least 4 µm, 5 µm, 6 µm or more.

The method may include forming a body region and a source region in the epitaxial layer. Typically, the body and source regions are formed by double implantation and diffusion. The body region may be formed directly above the p-column of the superjunction structure. The body region may be located directly above the upper superjunction zone, if there is only one, or directly above the uppermost of the upper superjunction zones, if there are more than one. The source region may be formed within the body region. The method may include forming a contact hole in the body region and/or in the source region.

Forming the epitaxial layer may include forming an n-doped uppermost drift zone above the upper drift zone(s) and laterally adjacent to the body region, i.e., in a neck region of the power semiconductor device. The n-type doping of the uppermost drift zone may be higher than the n-type doping of the lower drift zone(s). The n-type doping of the uppermost drift zone may be substantially the same as that of the upper drift zone(s).

Formation of the epitaxial layer and its structures, such as superjunction, body and source, may involve high temperature processes with process temperatures above 950° C. or above 960° C. The subsequent formation of further structures may exclusively involve low-temperature processes, i.e., processes at temperatures below 950° C., typically below 930° C. or below 900° C. according to some embodiments of the invention.

The method may include forming a dielectric layer on the epitaxial layer. Forming the dielectric layer may include forming the dielectric layer thicker above the drift region of the epitaxial layer than above at least part of the body region. The dielectric layer may be formed at a temperature less than 950° C., or even less than 920° C. or less than 900° C. Forming the dielectric layer with such a low temperature process may be performed after forming the source and body region, in particular after high temperature diffusion processes. The dielectric layer may include a thick part and a thin part. The thick part may lie over, i.e., overlap, the n-column of the drift region. The thick part may overlap a part, in particular a substantial part, of the body region that is adjacent to the drift region. The thin part lies over the body region. The thick part may include or consist of at least two sub-layers, in particular a first dielectric layer such as a cap oxide layer and a second dielectric layer such as a gate oxide layer. The thin part may include or consist of one layer, in particular the gate oxide layer. The first dielectric layer may be formed by a local process using a mask. The second dielectric layer may be formed by a global process, and may subsequently be structured, e.g. by etching.

Forming the dielectric layer may include forming the dielectric layer thicker in a first part above the body region than in a second part above the body region. The first part may be above an end of the body region towards the neck region or uppermost drift region. The first part of the dielectric layer may overlap at least 5%, at least 10%, at least 30% or at least 50% of the length of the body region, at the end adjacent to the neck region. Forming the dielectric layer may include forming a cap oxide layer, and forming a gate oxide layer above the cap oxide layer. The cap oxide layer may be formed by local oxidation of silicon (LOCOS). The cap oxide layer may include or consist of a structured field oxide. The cap oxide layer may be formed as a processed, grown or deposited oxide layer. The cap oxide layer may include or consist of $SiO_2$. The cap oxide layer may include or consist of other dielectrics than $SiO_2$. The gate oxide layer may be a $SiO_2$ layer.

The thick part of the dielectric layer may have a thickness of from 100 to 600 nm, typically from 200 to 400 nm, e.g. about 260 nm. This thickness may, e.g., be the sum of the thicknesses of a first and a second dielectric sub-layer. The thin part of the dielectric layer may have a thickness of from 30 nm to 150 nm, typically from 50 nm to 100 nm. The thickness of the thin part may be the thickness of the second dielectric layer. The thickness of the first dielectric layer may be from 50 to 550 nm, typically from 100 to 300 nm, e.g., about 200 nm. The thick part of the dielectric layer may be 1 to 20 times thicker than the thin part, e.g., 6 to 10 times thicker. The cap oxide layer may be 1 to 20 times thicker than the gate oxide layer, e.g., 6 to 10 times thicker.

The method may include forming a gate electrode, typically of polysilicon, above the dielectric layer. The thickness of the gate electrode may be from 100 nm to 1000 nm, e.g., from 400 to 700 nm, such as about 540 nm. The method may include forming an intermediate isolation layer above the gate electrode. The thickness of the isolation layer may be from 0.5 to 3 µm, e.g., from 1 µm to 2 µm, such as about 1.3 µm. The dielectric layer, the gate electrode and/or the intermediate isolation layer may be structured, e.g., by etching. In particular, contact holes to the gate electrode may be formed, and contact holes to the source and body region may be formed therein. The method may include forming a source electrode above the intermediate isolation layer. The source electrode may be formed such that it contacts the source and body region via a contact hole. The thickness of the source electrode may be from 1 to 6 µm, e.g., from 3 µm to 6 µm, such as about 4.7 µm. A gate metallization may be formed to contact the gate electrode.

According to further embodiments, a power semiconductor device is provided. The power semiconductor device includes a semiconductor substrate, and an n-doped epitaxial layer directly above the semiconductor substrate. The epitaxial layer includes a body region, a source region connected to the body region, and a drift region. The semiconductor device may include a dielectric layer above the epitaxial layer, and a gate electrode above the dielectric layer for controlling an inversion channel in the body region between the source region and the drift region. The source region may be connected to a source electrode. The body region may also be connected to the source electrode. The substrate may be connected to a drain electrode.

The epitaxial layer may further include a buffer layer directly above the semiconductor substrate. The buffer layer may have an n-type doping that decreases in the direction from the semiconductor substrate to the epitaxial layer. The buffer layer may be a buffer layer with graded doping or may be a buffer layer including a first sub-layer and at least one second sub-layer with different doping. A first zone of the graded buffer layer closest to the epitaxial layer may have a mean doping less than or equal to $4 \times 10^{15}$ cm$^{-3}$. The first sub-layer, which is closest to the epitaxial layer, may have a doping less than or equal to $4 \times 10^{15}$ cm$^{-3}$. The thickness of the first sub-layer or of the first zone may be at least 8 µm. The thickness of the buffer layer may be at least 12 µm.

The epitaxial layer may include a p-type doped superjunction structure. The body region may be connected to the superjunction structure. A region in the epitaxial layer outside of the body region, of the source region, and of the superjunction structure, if present, may form the drift region. An upper superjunction zone of the superjunction structure directly below the body region may contain a higher p-type absolute doping dose than at least one lower superjunction zone of the superjunction structure below the upper superjunction zone. An upper drift zone of the drift region laterally adjacent to the upper superjunction zone may contain a higher n-type absolute doping dose than at least one lower drift zone of the drift region below the upper drift zone. The difference between the n-type net doping dose of the upper drift zone and the p-type net doping dose of the upper superjunction zone may be larger than the difference between the n-type net doping dose of the at least one lower drift zone and the p-type net doping dose of the at least one lower superjunction zone.

The absolute doping dose of the upper superjunction zone may be at least 20% higher than the absolute doping dose of the at least one lower superjunction zone. The absolute doping dose of the upper drift zone may be at least 20% higher than the absolute doping dose of the at least one lower drift zone. The difference between the n-type net doping dose of the upper drift zone and the p-type net doping dose of the upper superjunction zone may be at least 50% larger than the difference between the n-type net doping dose of the at least one lower drift zone and the p-type net doping dose of the at least one lower superjunction zone. An uppermost drift zone above the upper drift zone and laterally adjacent to the body region may have an n-type absolute doping dose higher than the n-type absolute doping dose of the at least one lower drift zone.

The dielectric layer may be thicker above the drift region than above the body region. The dielectric layer may have a specific micro-structure as obtained by forming the dielectric layer with a low-temperature process at a temperature less than 950° C. The ratio of the thickness of the dielectric layer and of the thickness of the gate electrode may vary along the length of the gate electrode. This variation may be due to the dielectric layer becoming thicker or may be due to the gate electrode being fully recessed in parts, i.e., having a thickness of zero in recessed parts. The dielectric layer may be thicker above the drift region than above at least part of the body region. The dielectric layer may include a cap oxide layer at least above the drift region, and a gate oxide layer above both the drift region and the body region. The dielectric layer may include a cap oxide layer above the drift region and above a part of the body region, and a gate oxide layer above both the drift region and the body region.

The power semiconductor device may further have any of the properties described with respect to a method of forming a power semiconductor device and shown in the figures, such as spatial relations and proportions, and materials used.

According to further embodiments the use of a power semiconductor device as described herein is provided, in particular the use in high-radiation environments such as aerospace, high-atmosphere, scientific or medical applications. Embodiments may meet the requirements of the European Space Agency (ESA) or of the National Aeronautics and Space Administration (NASA) for aerospace applications.

Additional features that may be combined with any of the embodiments described herein to yield further embodiments are disclosed in the article "Radiation-hardened 250V Superjunction Power MOSFET" by Markus Schmitt et al., IEEE Conference Proceedings of RADECS2012 conference, which is enclosed herein by reference in its entirety.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, zones etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The explanations about why the described layouts of semiconductor components and methods of forming them lead to a radiation-hardening shall not bind to applicant to any particular theory.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a power MOSFET semiconductor device, comprising:
   providing a semiconductor substrate comprising a drain region in ohmic contact with a drain electrode arranged on the semiconductor substrate;
   forming an epitaxial layer on the semiconductor substrate, the epitaxial layer comprising a body region, a source region, and a drift region, the body region, the source region, and the drift region extending to a main surface of the epitaxial layer;

forming a dielectric layer on the main surface of the epitaxial layer, wherein the dielectric layer has a thick part and a thin part, wherein the thick part of the dielectric layer directly adjoins the drift region at the first surface and directly adjoins a part of the body region that is laterally adjacent to the drift region at the first surface, and wherein the thin part of the dielectric layer is laterally disposed between the thick part of the dielectric layer and the source, and wherein the dielectric layer is formed at a temperature less than 950° C.; and forming a gate electrode on the dielectric layer at least above the body region, wherein forming the epitaxial layer comprises:

forming a superjunction structure in the epitaxial layer, wherein (a) an upper superjunction zone of the superjunction structure below the body region is formed with a higher first-type doping than a lower superjunction zone of the superjunction structure below the upper superjunction zone, or (b) an upper drift zone of the drift region laterally adjacent to the upper superjunction zone is formed with a higher second-type doping than a lower drift zone below the upper drift zone, or (c) the upper superjunction zone is formed with a higher first-type doping than the lower superjunction zone and the upper drift zone is formed with a higher second-type doping than the lower drift zone;

wherein the difference between a net dose of the higher first-type net doping dose of the upper superjunction zone and a net dose of the higher second-type net doping dose of the upper drift zone is larger than the difference between a net dose of the higher first-type net doping dose of the lower superjunction zone and a net dose of the second-type net doping dose of the lower drift zone, and wherein forming the epitaxial layer comprises:

forming a second-type doped uppermost drift zone above the upper drift zone and laterally adjacent to the body region, wherein the second-type doping of the uppermost drift zone is higher than the second-type doping of the at least one lower drift zone.

2. The method according to claim 1, wherein forming the dielectric layer comprises:

forming a cap oxide layer;

and forming a gate oxide layer above the cap oxide layer.

3. The method according to claim 2, wherein the cap oxide layer is formed by local oxidation of silicon (LOCOS).

4. The method according to claim 1, wherein forming the upper superjunction zone comprises implanting a first dose of a dopant, the first dose being between $1\times10^{11}$ and $1\times10^{15}$ cm-2 of the first-type dopant, and wherein forming the upper drift zone comprises implanting a second dose of a dopant, the second dose being between $1\times10^{11}$ and $1\times10^{15}$ cm-2 of a second-type dopant.

5. The method according to claim 1, wherein forming the epitaxial layer comprises:

forming a second-type doped uppermost drift zone above the upper drift zone and laterally adjacent to the body region, wherein the second-type doping of the uppermost drift zone is higher than the second-type doping of the at least one lower drift zone.

6. The method according to claim 1, wherein forming the epitaxial layer comprises:

forming a buffer layer directly above the semiconductor substrate, wherein the buffer layer is formed with a second-type doping that decreases in a direction from the semiconductor substrate to the epitaxial layer.

7. The method according to claim 6, wherein forming the buffer layer comprises:

(i) decreasing a doping concentration of the second-type doping while forming the buffer layer to form a buffer layer with graded doping, wherein a first zone of the buffer layer with graded doping closest to the epitaxial layer has a mean doping less than or equal to $4\times1015$ cm-3; or (ii) forming a first sub-layer and at least one second sub-layer with different doping, wherein the first sub-layer, which is closest to the epitaxial layer, has a doping less than or equal to $4\times1015$ cm-3.

8. The method according to claim 7, wherein a thickness of the first sub-layer or of the first zone is at least 8 µm, and wherein a thickness of the buffer layer is at least 12 µm.

9. The method according to claim 1, wherein the power semiconductor device is a power MOSFET or insulated-gate bipolar transistor.

10. A method of forming a power semiconductor device, comprising:

providing a semiconductor substrate; and forming an epitaxial layer above the semiconductor substrate, the epitaxial layer comprising a body region, a drift region, and a superjunction structure, wherein (a) the upper superjunction zone has a first-type doping which is at least 100% higher than a first-type doping of a lower superjunction zone and the upper drift zone has a second-type doping which is at least 30% higher than a second-type doping of the lower drift zone;

wherein the difference between a net dose of the first-type net doping dose of the upper superjunction zone and a net dose of the second-type net doping dose of the upper drift zone is higher than at least $2\times10^{12}$ cm$^{-2}$, and the difference between a net dose of the first-type net doping dose of the lower superjunction zone and a net dose of the second-type net doping dose of the lower drift zone is lower than $1\times10^{12}$ cm$^{-2}$, and wherein the drift region has a neck zone which is laterally adjacent to the body region and above the upper drift zone, the neck zone having the same or a lower second-type doping than the upper drift zone.

* * * * *